United States Patent

Land

[19]

[11] Patent Number: 6,043,877
[45] Date of Patent: Mar. 28, 2000

[54] CALIBRATION CARRIER FOR A COMPONENT PLACEMENT MACHINE HAVING AN ADHESIVE REFLECTIVE SURFACE

[75] Inventor: Egbert F. A. Land, Eindhoven, Netherlands

[73] Assignee: U.S. Philips Corporation, New York, N.Y.

[21] Appl. No.: 08/975,385

[22] Filed: Nov. 20, 1997

[30] Foreign Application Priority Data

Nov. 26, 1996 [EP] European Pat. Off. .............. 96203330

[51] Int. Cl.[7] .................................................. G06K 9/00
[52] U.S. Cl. ........................................................ 356/243.1
[58] Field of Search .............................. 356/243.1, 399, 356/400, 401; 382/151, 287; 348/87

[56] References Cited

U.S. PATENT DOCUMENTS

| | | | |
|---|---|---|---|
| 4,692,690 | 9/1987 | Hara et al. ............................... | 356/394 |
| 4,738,025 | 4/1988 | Arnold ..................................... | 29/834 |
| 4,808,003 | 2/1989 | Kessels .................................... | 356/376 |
| 4,874,246 | 10/1989 | Den Boef ................................. | 356/375 |
| 4,978,224 | 12/1990 | Kishimoto et al. ..................... | 356/394 |
| 5,084,959 | 2/1992 | Ando et al. ............................. | 29/740 |
| 5,237,622 | 8/1993 | Howell .................................... | 356/243.1 |
| 5,247,844 | 9/1993 | Howell .................................... | 356/243.1 |
| 5,278,634 | 1/1994 | Skunes et al. .......................... | 356/400 |
| 5,537,204 | 7/1996 | Woodhouse ............................ | 356/243.1 |
| 5,547,537 | 8/1996 | Reynolds et al. ....................... | 156/351 |

OTHER PUBLICATIONS

"Fast Component Mounter", Philips Electronics Mfg. Technology, Jan. 1996, pp. 1–15.
"Fast Component Mounter—(Laser)", Philips Electronic Mfg. Technology, Jul. 1996, pp. 1–38.

*Primary Examiner*—Richard A. Rosenberger
*Attorney, Agent, or Firm*—Anne E. Barschall

[57] ABSTRACT

A calibration method and device are described, notably for a component-placement machine for placing components (30) on a carrier (3), which machine comprises carrier-positioning means (50) and component-positioning means (26, 27, 11; 40). The positions of components placed on a calibration carrier (60, 65) during a calibration procedure is detected by means of a calibration carrier detection device (50) which is present in the machine itself. For obtaining a satisfactory contrast between the components (30) and the calibration carrier surface, the latter may be provided with a reflecting and adhesive foil (65, 66). In a machine provided with a production carrier detection device, this device may be used as a calibration carrier detection device.

FIG. 3.

2 Claims, 7 Drawing Sheets

CALIBRATION CARRIER FOR A COMPONENT PLACEMENT MACHINE HAVING AN ADHESIVE REFLECTIVE SURFACE

The invention relates to a method of placing components on at least a carrier, in which method said carrier is fed into a component-placement machine under the control of carrier-positioning means, and in which a component, after having been picked up by a placement head of the machine, is positioned with respect to the placement head by means of component-positioning means, whereafter the component is placed on the carrier, while the end position of the component is also determined by means of at least a calibration procedure prior to the actual placement procedure, in which calibration procedure the placement accuracy of the placement machine used is checked.

The invention also relates to a component-placement machine suitable for performing the method, to a calibration carrier detection device for use in the machine, and to an optical detection device forming part of the calibration carrier detection device.

The calibration procedure referred to above is a test and control procedure in which the machine is caused to place components in accordance with a given placement action specification, the positions of the placed components are subsequently measured and compared with the desired positions of these components and the result thereof is used to realize that the components are placed as accurately as possible at the desired positions during the actual, or production, placement procedure.

A component-placement machine in which the above-mentioned method may be used has been manufactured by Philips for several years under the type name of FCM (Fast Component Mounter) and is described, inter alia, in the brochures: "Fast Component Mounter" and "Fast Component Mounter—(laser) Specifications" of Philips Electronic Manufacturing Technology, issued in January 1996 and July 1996, respectively. The carriers and the components are separately fed to the machine. The machine is provided with a transport system for transporting carriers consecutively to a number of placement stations to be chosen, up to a maximum number of, for example sixteen, where the components are placed on the carrier. The transport system comprises a number of transport plates each intended for picking up one or more carriers and transporting them on a part of the machine length and along guide rails. The machine further comprises a number of placement heads in conformity with the number of placement stations. Each transport plate may move a carrier, for example a printed circuit board, stepwise along at most several of the placement heads, with each transport step having a well-defined length. Such a transport step is also referred to as index. The sum of these indices, or transport steps for a transport plate is equal to the length of this plate. If a first transport plate has arrived at the end of its path, the carrier on this plate is taken over by a second transport plate which moves the carrier along a subsequent small number of placement heads.

At least a feeder, or feeding device, with which components to be placed are fed into the machine, is associated with each placement head. Each placement head, which is controlled by a separate robot, every time picks up a component from one of the associated feeders and transports it to the position on the carrier where the component must be placed. Each placement head has a fixed work range, i.e. a range across which the head can be moved and within which it can place components. In consecutive transport steps, each time a different part of the carrier is brought within the work range of one and the same head.

Each robot is provided with means for positioning and orienting a component with respect to the robot axes. This positioning may be realized mechanically by positioning the component with the aid of mechanical adjusting means which can be operated in different directions and through defined distances. The component-positioning means may also comprise an optical component-detection device, for example, in the form of a laser aligning system (LAS) in which a shadow image of the component is formed on a detector, for example a CCD sensor. The optical component-detection device may alternatively be constituted by a camera with which the component is observed and with which, for example, the positions of the component tags are detected. The position data are applied to a signal-processing unit associated with the robot and compared in this unit with reference data. This provides the possibility of correcting the positions during transport of the component to the placement station, for example, by correction displacements in the X and Y directions of an XYZ system of coordinates and/or rotations about the placement head axis extending in the Z direction. The component-detection device may also identify a component and check its quality. All these kinds of measurements are considered to fall within the scope of the term: detection of a component.

For accurately placing a component on a carrier, the electrically conducting track pattern on the production carriers should also be aligned with respect to machine references. To this end, the machine is provided with carrier-positioning means. The carrier positioning may be realized purely mechanically by providing the transport plates of the machine with pins and the carriers with holes for accommodating these pins. In addition, a carrier-detection device may be provided for aligning the track pattern in the feed-in section of the machine, which device comprises a robot and an optical carrier-detection device known as board vision module (BVM), and a camera. With this device, a picture is taken of two or more alignment marks (fiducials) which are present on the carrier. The relative positions on the carrier, where the components must be placed with respect to these marks are known in advance. The data about the positions of the marks supplied by the carrier-detection device are applied to an image processor associated with this detection device, in which processor they are compared with data stored therein. Subsequently, deviations are computed. The information thus obtained and the information supplied by the component-detection device provides the possibility of positioning a placement head accurately above a desired position on a carrier and of placing and fixing the component retained by this head at the desired position.

Components can be placed with great accuracy and speed by means of an FCM machine. This accuracy is maintained for a long time. However, when the machine is put into operation and after a large number of operating hours, for example 3000, the machine must be calibrated so as to guarantee the right settings of the machine and correct the machine settings which may have changed after a long period of use. Dependent on the use and the user's wishes, such a calibration may also be performed periodically after, for example substitution of a placement head or of a robot motor or a drive belt, and when changing over to another type of carrier. The calibration may be performed with a separate calibration set supplied with the machine, comprising an illumination module, a camera and an image-processing unit, or Vision Module, which set is connected to the machine only during the calibration process. With the aid of this calibration set, the system of coordinates of each placement robot can be coupled, per transport plate index, to the system of coordinates of the machine transport constituted by the transport plates and the guide rails. To this end, two or more alignment marks are detected by the calibration camera for each placement head per transport plate and per index, and the calibration data are processed by the calibration vision module. To this end, the calibration carrier is provided with a number of sets of at least two alignment marks each, corresponding to the number of indices.

A separate calibration is performed for each placement head. The camera is placed on a first robot and a first calibration procedure is performed, subsequently the camera is placed on a second robot and a second calibration procedure is performed, and so forth. Special calibration plates are used which are provided with holes functioning as alignment marks. The shape and dimensions of a calibration plate correspond to those of the production carriers which will be fed into the machine after the calibration procedure, so that different types of calibration carriers must be used.

The present invention provides a component-placement method and machine using a novel calibration concept with which the calibration can be performed even more accurately and more rapidly and which provides the possibility of using detection means and associated signal-processing means which may already be present in the placement machine. The method using the novel concept is defined in claim 1.

Since the part of the carrier on which each placement head places components is known, the invention is based on the recognition that the accuracy of placement of all placement heads and the associated robots can be detected in one step, by detection of all placed components, and that it can be determined whether a correction must take place. Consequently, the calibration can be performed within a short period of time. Since a fixed detection device is used for checking all placement heads, the calibration will be more accurate and more reliable than in the case where calibration is effected with a separate camera which must consecutively be placed on all placement heads. Moreover, one type of calibration carrier can now be used.

The method according to the invention provides various embodiments which may be divided into two categories. The first category relates to the number of components which, and the positions where these components are placed during the calibration procedure and to the use of the data obtained during the calibration procedure.

A first embodiment of the first category is characterized in that the number of components which, and the positions where these components are placed on the calibration carrier is independent of the number of components which, and the positions where these components are placed on a production carrier, and in that the calibration data are used to bring the systems of coordinates of the placement heads in conformity with those of the transport system.

This adaptation is realized for each placement head per transport plate and per index thereof. The calibration carrier is then aligned only mechanically by means of the pins on the transport plate and the holes in the calibration carrier, and components are placed on the calibration carrier in accordance with a calibration placement action specification.

Prior to a production phase, in which components are placed on a production carrier, the computer for the placement machine computes, on the basis of the type of production carrier, which placement heads will place which components at which positions. The prescription thus obtained for the actions to be performed by the various placement heads is referred to as production placement action specification. Also in the calibration procedure, the components are placed in accordance with a given prescription. This is referred to as the calibration placement action specification.

A second embodiment of the first category is characterized in that components are placed on the calibration carrier in accordance with the production placement action specification, and in that the calibration data are stored and used, during placement of components on a production carrier, for correcting a placement position per component.

In this case, the number of components placed on the calibration carrier is the same as the number placed on the production carrier and at the same positions at a later stage, while the components placed on the calibration carrier are identical to, or cheaper than, the components which are placed on the production carrier.

In accordance with a further characteristic feature of the second embodiment, a calibration step may also be incorporated in a production placement procedure if a carrier is to be provided with components in accordance with the production placement action specification and if the positions of the placed components are detected. The differences measured between the desired and the realized placement positions can then be used for correction in the next part of the production placement procedure.

The second category of embodiments of the method relates to measures of improving the detection of the components.

A first embodiment of the second category is characterized in that use is made of a calibration carrier in the form of a production carrier, one side of which is provided with an adhesive layer for retaining components, and in that a beam obliquely incident on the carrier is used for detecting placed components.

This layer, for example an adhesive layer or a fast drying lacquer layer, may be selected for its reflection properties, i.e. it may be satisfactorily reflective or, in contrast, less satisfactorily reflective so that the layer not only has an adhesive function but also an optical function.

For the calibration procedure, components are placed on this carrier in accordance with a calibration placement action specification or in accordance with the production placement action specification, whereafter the carrier is again fed into the machine so as to be detected by means of the calibration detection device. Then, use is made of the fact that the production carrier reflects to a larger extent than the placed production components and that less light of the obliquely incident illumination beam is reflected by the carrier towards the camera of the calibration carrier detection device than is reflected by the placed components. Such a component is then observed as a brighter element against a darker background.

A second embodiment of the second category is characterized in that use is made of a calibration carrier in the form of a production carrier, one side of which is provided with an adhesive layer for retaining components, and in that said components are provided with optically detectable marks.

These mark may have various shapes, for example cross shapes, squares, etc. and during detection their positions are determined with respect to the desired positions of the placed components.

A third embodiment of the second category is characterized in that use is made of a calibration carrier in the form of a production carrier, one side of which is provided with an adhesive layer for retaining components, and in that said components are special components which, upon illumination, reflect more radiation than the carrier surface.

These components may be satisfactorily reflecting or fluorescent components or phosphorescent components.

It is thereby achieved that the components to be detected are clearly distinguished from their background constituted by the less satisfactorily reflecting carrier surface.

A fourth embodiment of the second category, which is preferred to the three above-mentioned embodiments, is characterized in that, during the calibration procedure, use is made of a carrier whose part on which components must be placed has a higher reflection than said components.

Customary production components or cheaper components may be placed on this carrier. Since these components reflect less satisfactorily, and generally more diffusely, than the reflecting layer, a background illumination of these components is simulated when illuminating the carrier provided with components, so that these components can easily be recognized, independent of their color or shape. During the detection, an illumination beam may be used which is either substantially perpendicularly, or obliquely incident on the carrier. In the latter case, the relatively satisfactorily reflecting carrier surface reflects the obliquely incident illumination beam into a direction beyond the range of the camera of the calibration carrier detection device, while, due to the diffusely reflecting character of the components, these components reflect radiation towards this camera, so that also in this case the components appear as brighter elements against a darker background.

A fifth embodiment of the second category is most preferred and is further characterized in that, during the calibration procedure, a carrier is used whose part on which components must be placed is completely covered with a reflecting foil which is adhesive on the side remote from the carrier.

In this method, a novel and inventive calibration carrier having an optimum combination of properties is used, namely: it is eminently suitable for detecting placed components, and it is inexpensive because the foil and the carrier are inexpensive, while the carrier may be a production carrier so that it is automatically adapted to the production carriers on which components must be placed after the calibration procedure. These components are no longer retained in their position by means of soldering paste or glue, as in the course of the production process, but by means of the adhesive foil.

In order that the placed components are observed by the detection device as dark objects against a light background, the method is preferably further characterized in that, during the calibration procedure, when detecting components placed on a carrier, this carrier is illuminated with a beam having an aperture angle of the order of at most 30 degrees.

The novel calibration carrier is preferably further characterized in that the foil is secured to the carrier by means of an adhesive layer.

This securing method is inexpensive, rapid and sufficiently reliable.

In analogy with commonly used production carriers, these and other calibration carriers may be provided with a number of discrete alignment marks for aligning the calibration carrier as a whole with respect to machine references. However, a calibration carrier may also be characterized by a reference structure in the form of a two-dimensional pattern of optically detectable strips.

Upon detection of placed components, the part of this pattern in the vicinity of a component to be detected can be observed simultaneously with this component. This provides an absolute reference for the position of the placed components and it is possible to calibrate independently of the accuracy of the machine servosystems.

The invention also relates to a component-placement machine comprising:
 a frame,
 at least a robot,
 a transport system for transporting carriers,
 carrier-positioning means for positioning a carrier with respect to the transport system,
 per robot, a placement head for placing components on a carrier, which placement head is secured to an arm of the robot, and
 per robot, component-positioning means for positioning a component retained by the placement head associated with the robot. To be able to realize the novel calibration concept with this machine, it is characterized in that the machine is provided with at least a calibration carrier detection device for detecting, during a calibration procedure, components placed on a calibration carrier.

Since parts of the machine are now used for checking products manufactured by means of this machine, the check can be performed in an accurate, reliable and simple manner.

The invention further relates to a calibration carrier detection device to be incorporated in a placement machine operating on the basis of the novel calibration concept. This device is characterized by an XY robot and an optical calibration carrier detection device secured thereto.

A first embodiment of the calibration carrier detection device is characterized in that the optical calibration carrier detection device comprises an optical height-measuring system.

Examples of such height-measuring systems are described in U.S. Pat. Nos. 4,808,003 and 4,874,246. Since a component placed on the calibration carrier projects from the surface of this carrier, it is possible to find out with the aid of a height meter whether and where a component is present in an area on the carrier.

A preferred embodiment of the calibration carrier detection device is, however, characterized in that the optical calibration carrier detection device comprises a camera for recording images of placed components.

In principle, such an optical calibration carrier detection device is simpler than the device comprising a height-measuring system.

The invention further relates to an optical detection device for use in the last-mentioned calibration carrier detection device. This optical detection device is characterized in that it comprises an illumination system for supplying an illumination beam having an aperture angle of the order of at most 30 degrees, the chief ray of said beam being substantially perpendicularly incident on the carrier, and further comprises an imaging system for imaging an illuminated part of the carrier on a radiation sensitive detector in the camera.

An embodiment of the optical detection device is characterized in that the illumination system comprises a radiation source in the form of a plurality of radiation-emitting diodes and at least a diffuser.

The optical detection device may be further characterized in that the illumination system has a partially transparent mirror layer which is placed at such an angle that the chief ray of the illumination beam coming from this mirror layer is substantially perpendicularly incident on the carrier.

The optical detection device is preferably further characterized in that the imaging system is telecentric on the side of the carrier.

It is thereby achieved that, for imaging a carrier part on the detector, only beam portions are used whose chief rays are perpendicular to the carrier. The effect thereof is that the contour of a component is imaged in a plane perpendicular to the optical axis on the detector of the camera and that no magnification variations due to the curvature of the carrier can occur in this image.

The carrier-positioning means may not only comprise pins on the transport plates and holes in the carriers, but also a production carrier detection device for detecting alignment marks on this carrier. A placement machine comprising such a detection device may be further characterized in that the calibration carrier detection device is constituted by the production carrier detection device.

These and other aspects of the invention are apparent from and will be elucidated with reference to the embodiments described hereinafter.

Figure 1:
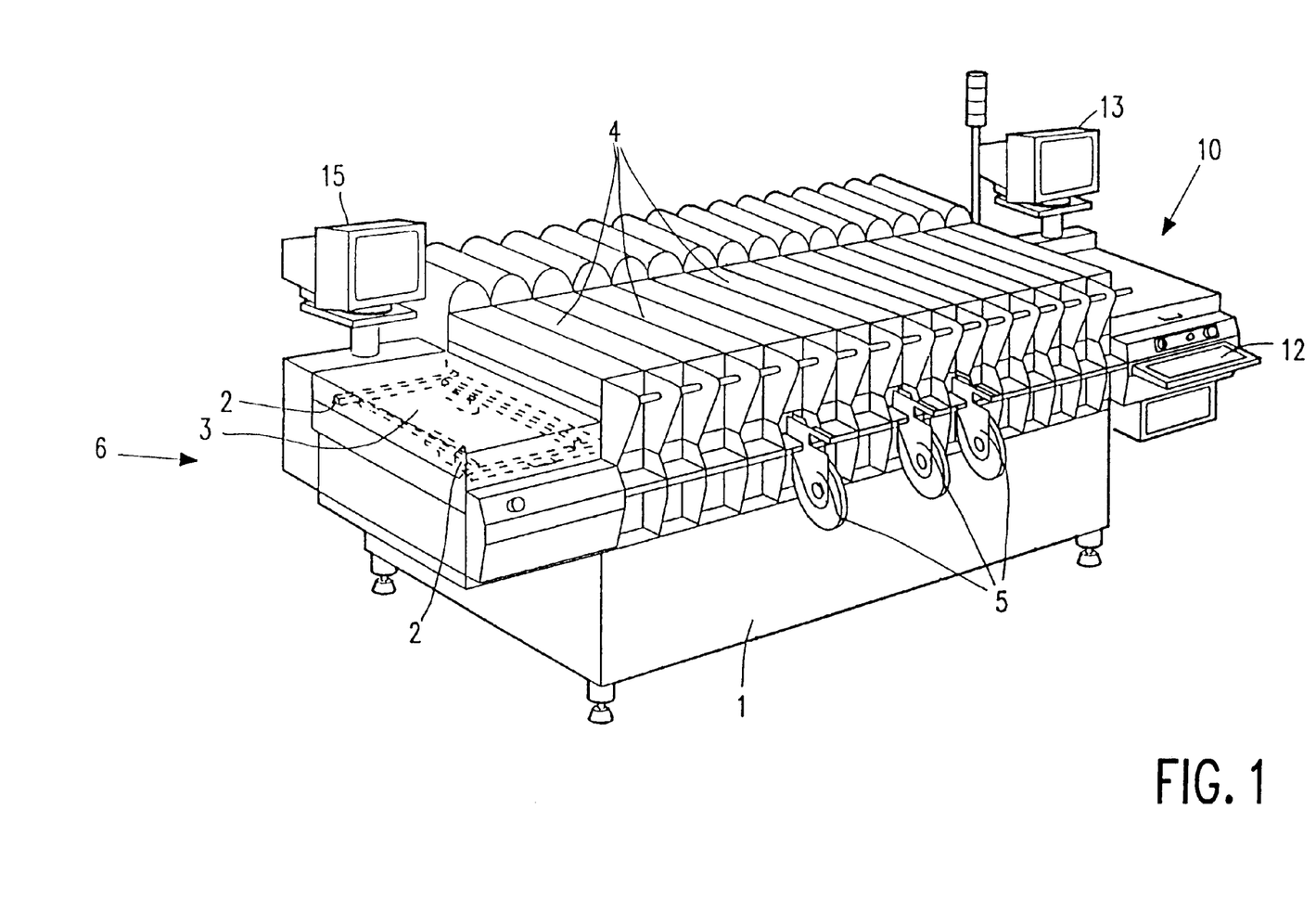
FIG. 1 is a perspective elevational view of an embodiment of the placement machine.

FIG. 1 shows an embodiment of a component-placement machine in a perspective elevational view. This embodiment comprises sixteen placement units 4 arranged on a machine frame 1. The components to be placed are fed in separately for each placement unit, for example, by means of one or more belts which carry the components and from which they can easily be removed. These belts are transported by an equally large number of roll-feeder systems, which systems also remove the components one by one from the belts. For the sake of clarity, FIG. 1 shows only one roll feeder 5 per placement unit. Actually, a number of, for example five, feeders may be provided per placement unit. Instead of being fed in by roll-feeder systems, the components may alternatively be fed in by bulk-feeder systems.

The carriers, or printed circuit boards, to be provided with components are fed into the machine via the feed-in section 6 present on the left-hand side of the machine. In this section, the broken lines 2 denote guide rails and the broken lines 3 denote a printed circuit board. The printed circuit boards provided with components are fed out of the machine via the feed-out section (not visible in FIG. 1) which is present on the right-hand side of the machine. An operating unit 10 is also present on this side. This unit comprises a computer (not visible), a keyboard 12 for entering commands and a monitor 13 for displaying entered commands and process data. This monitor may be constituted by the monitor of the machine computer, in which said commands only occupy a part of the monitor image. A second monitor 15 is present on the left-hand side of the machine, which monitor forms part of the calibration device and with which a placed component observed by the calibration camera during the calibration procedure is rendered visible to the machine operator.

The machine may be very compact and has a length of, for example approximately 3 m, a depth of approximately 2 m and a height of approximately 1 m.

Figure 2:
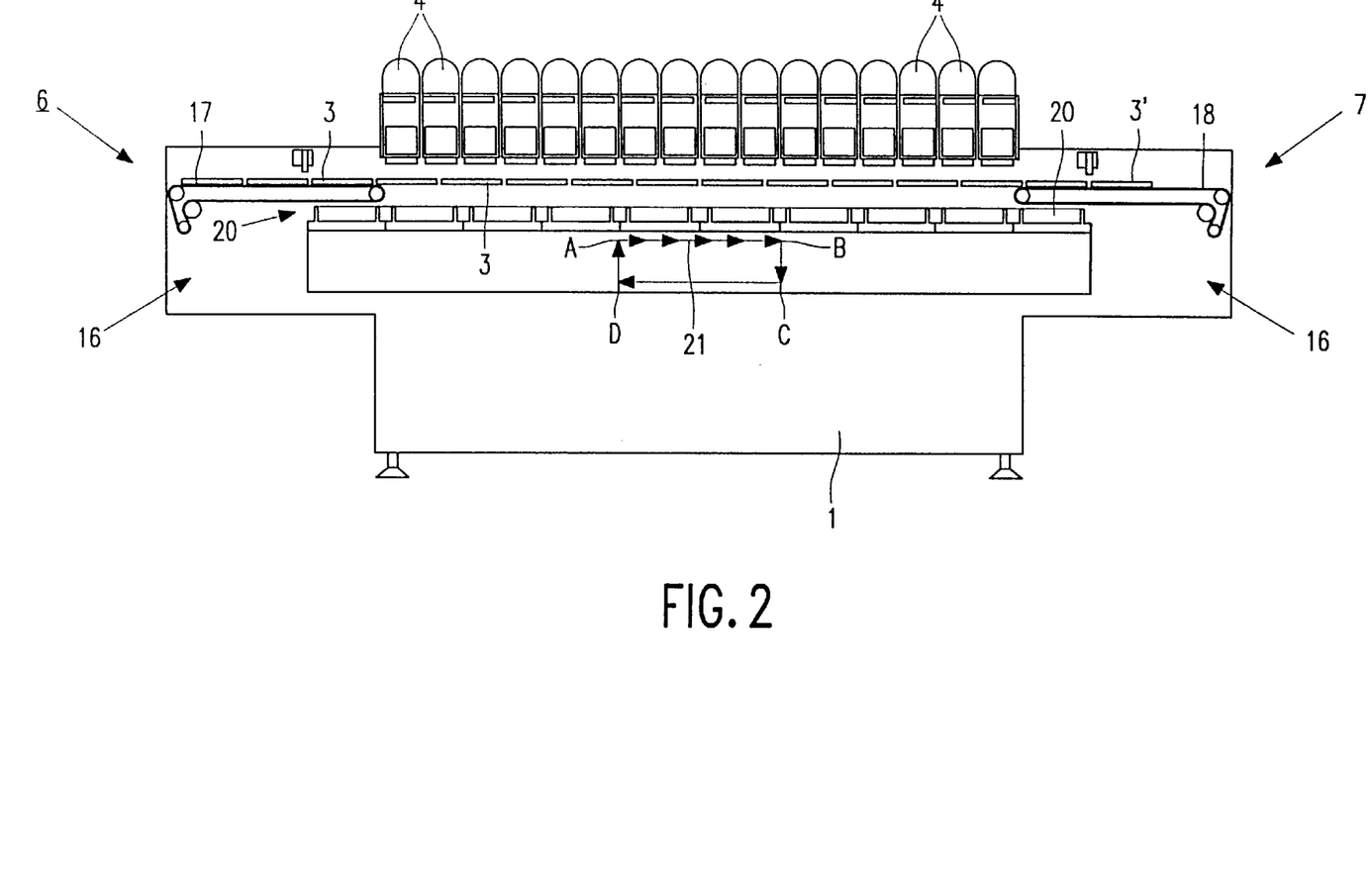
FIG. 2 is a longitudinal cross-section of this machine.

FIG. 2 shows the machine in a longitudinal section. In this Figure, the placement units 4 are visible again. The transport system of the machine comprising a number of transport plates 20 is present underneath these units. Each of these plates moves under the guide rails 2, denoted by the reference numeral 2 in FIG. 1, and is intended for picking up a printed circuit board or a plurality of printed circuit boards 3 so as to move them between the guide rails in the longitudinal direction of the machine. In the embodiment shown in FIG. 2, each transport plate has a limited stroke, i.e. it can move a carrier along a small number of placement units. This is symbolically denoted in FIG. 2 by means of the loop 21 with arrows 22 and starting position A and end position B for a given transport plate. Upon arrival at the end position B, the transport plate is moved downwards, with the carrier or carriers provided thereon coming to rest on the lower guide rails. The transport plate is then moved back to the left, from position C to position D and then upwards again, to position A, to pick up the next carrier(s) at that position. The carrier(s) present at position C are picked up by a transport plate returning from a position, which is more to the right, towards the position C so as to be further transported. The movement of a transport plate from position A to position B is divided into a number of transport steps, or indices, all of which have a defined length, which lengths may be different. FIG. 2 further shows the feed-in mechanism 17, the feed-out mechanism 18 and the transport bar mechanism 19.

Figure 3:
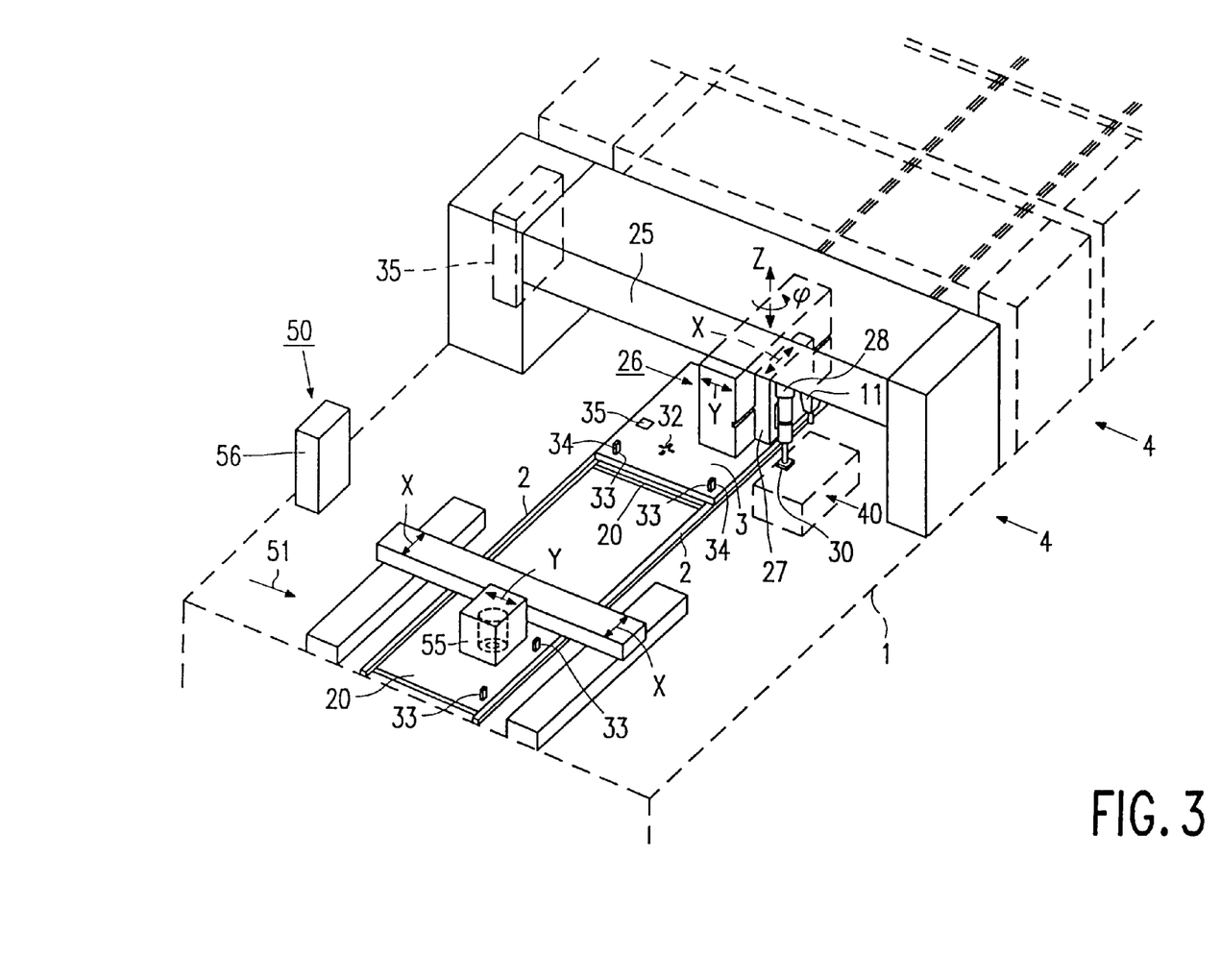
FIG. 3 shows a first embodiment of a placement unit and a part of the transport system of the machine.

FIG. 3 shows, inter alia, a placement unit in greater detail. In this Figure, the frame is shown diagrammatically by means of the broken line 1. This frame supports the transport system with the transport rails 2 and the transport plates 20. A number of component-placement units 4, three of which are shown, is present above the transport system. Each placement unit is constituted by a U-shaped frame 25 to which an X-Y-Z robot 26 is secured. The X, Y and Z movements of the robot are denoted by arrows. The robot may also rotate a component about the Z axis, which is denoted by the arrow φ. A placement head 28, with which components can be placed on a carrier, is secured to an arm 27 of the robot. The placement head is provided with a suction pipet 29 with which a component 30 can be picked up from a feeder system (not shown) and placed on a carrier 3.

A camera 40 may be secured on the machine frame under and in line with the placement head, similarly as described in U.S. Pat. No. 5,084,959. This camera then forms part of the component-positioning means. The camera 40 is preferably a commonly used CCD camera which has the advantage that it is small and relatively inexpensive. The camera can detect the position of a component 30 picked up by the placement head in the X and Y directions, and the orientation, as well as the rotation about a Z axis parallel to the axis of the pipet. The position data are applied to a signal-processing unit 37 associated with the robot and having the form of a stationary image processor in which these data are compared with the data of a modeled image stored in the processor. The deviations are computed and, when the component is placed on the carrier, these deviations are taken into account. The results of these computations may provide the possibility, for example during transport of the component to the carrier, of correcting the positions by causing the robot to perform correction displacements in the X and/or Y direction and/or rotations about the Z axis. By performing the corrections during transport of the component from the feeder element to the carrier, referred to as the "in-flight" check, it is possible to save time and increase the feed-through rate of the carriers.

Figure 4:
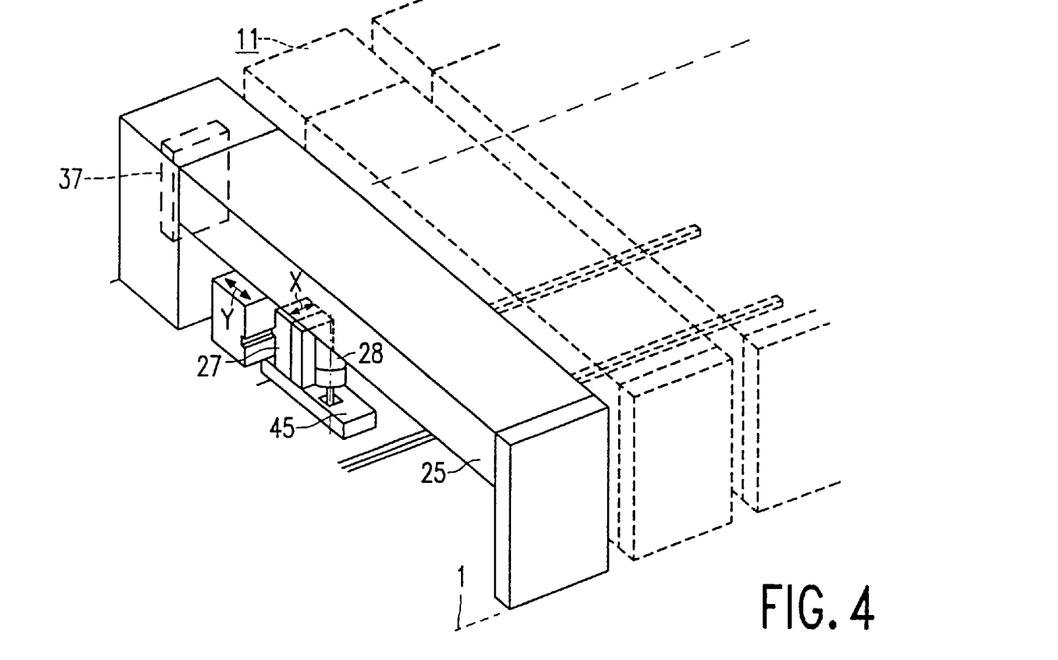
FIG. 4 shows a second embodiment of a placement unit.

Instead of a CCD camera, the component-positioning means may also comprise a Laser Alignment System (LAS) for detecting the position of the component with respect to the pipet. Such a system is described in U.S. Pat. No. 5,278,634. The advantage of the LAS is that it is small and light-weight and can thereby be secured to the placement head and move along with this head. FIG. 4 shows a part of an embodiment of the placement machine in which the placement heads are provided with such a LAS 45 which is secured to the lower side of the placement head 28. A component retained by the pipet of the placement head 28 is first fed into the LAS 45 so as to measure its position and orientation and is subsequently moved towards the carrier, during which movement position corrections are performed, if necessary.

Positioning a component with respect to a pipet may alternatively be realized by means of mechanical adjusting means mounted on the placement head 28, which means push the component into the correct position through the friction of the pipet, using well-defined forces in the X and Y directions.

Moreover, for accurately placing a component on a carrier, the exact location of a position 32 where a component must be placed on the carrier must be laid down with respect to the transport system, notably with respect to a transport plate on which this carrier is placed. This is realized by means of the carrier-positioning means. These means may be mechanical means in the form of pins 33 on the transport plate 20 and holes 34 at the edges of the carrier for accommodating these pins. Since the holes and pins have been provided very accurately and the holes have a large wear resistance, each carrier can always be positioned correctly with respect to the transport plate. Since, moreover, the relative location with respect to the holes 33 of the position 32 where the component must be placed is always known in advance, and the transport plates perform well-defined movements, the location where a component is about to be placed by a given placement head is well-defined with respect to the axes of the robot associated with the placement head.

Instead of, but preferably in addition to, the mechanical positioning means 33, 34, the carrier-positioning means of the machine may comprise a module 55 and an optical carrier detection unit including an image sensor and an illumination system. This image sensor, preferably a CCD camera again, records given marks (fiducials) 35 which are usually present in the peripheral part of the carrier surface. The module 55 forms part of a carrier detection unit 50 comprising an X-Y robot 51 on which the module 55 is secured, and a signal-processing unit 56 in the form of an image processor. With the aid of the X-Y robot, the camera can be moved across the entire carrier surface so that a recording can be made of this entire surface. The module 55 is known as Board Vision Module. The relative location, with respect to the fiducials 35, of the position 32 where the component must be placed on the carrier is known in advance. The data, supplied by the image sensor of the module 55, about the positions of the fiducials with respect to machine references are applied in the form of an electric signal to the processing unit 56 in which they are compared with reference data stored in this unit. Subsequently, deviations are computed. In combination with data, supplied by the camera 40 or by the LAS module 45, if present, about the position of the component, it is now possible to move the placement head accurately to the location on the carrier where the component must be placed.

An embodiment of a placement machine as shown in FIGS. 1 and 2 has been manufactured by Philips for several years under the name of FCM (Fast Component Mounter). A separate calibration set is supplied with this machine, which set comprises, inter alia, a separate calibration camera, an illumination and optical module and an image processor to perform the calibration by means of separate calibration plates, which calibration is necessary after, for example, a transition from a first type of printed circuit board to another type or after replacement of a placement head or a robot motor or a drive belt. To be able to perform this calibration more rapidly and accurately, a calibration carrier detection device according to the invention, for detecting components placed on a calibration carrier, is built into the placement machine and a normal production printed circuit board is preferably used as a calibration carrier. If the machine must also perform the function of detecting alignment marks on a production carrier, a detection device may perform both this function and the function of detecting placed components on a calibration carrier. In that case, the calibration carrier detection device is constituted by the detection device 50 shown in FIG. 3.

Instead of using a single calibration carrier detection device arranged in the feed-in section or in the feed-out section, the components placed on a calibration carrier may alternatively be detected by securing a separate camera to each placement head. Such a camera is denoted by the reference numeral 31 in FIG. 3. This camera is in turn connected to an image-processing unit in which the position of a placed component observed by means of the camera is compared with the desired position. Since each placement head is provided with its own calibration camera, no interface between the placement heads and a central calibration carrier detection device is required for calibration, and the accuracy of the calibration can be enhanced.

The individual cameras 31 intended, in the first instance, for calibration, may alternatively be used for detecting alignment marks or structures on production carriers, so that the production carrier detection device of FIG. 3 can be dispensed with, obtaining the same advantages as when replacing a central calibration carrier detection device by such devices per placement head.

Figure 5:
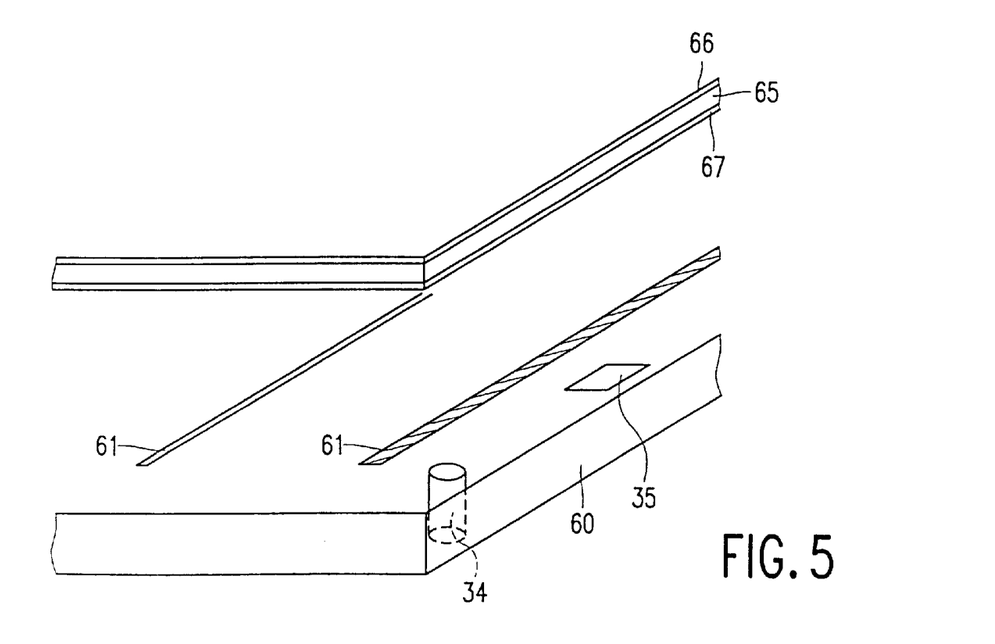
FIG. 5 is a perspective view of a part of a calibration carrier in accordance with the invention.

FIG. 5 is a perspective view of a small part of a calibration carrier according to the invention. This carrier comprises a printed circuit board 60 with conducting tracks 61. This board also has holes 34 and/or alignment marks (or fiducials) 35. According to the invention, a foil 65 having a reflective upper side is provided on the plate 60. The structure of conducting tracks and solder pads, the different elements of which have different reflection coefficients, is thereby covered and the board acquires a uniform and high reflection. The foil has such a size and/or geometry that said holes and/or fiducials are not covered. To be able to retain components, the upper side of the foil 65 is made adhesive, which is diagrammatically indicated in FIG. 5 by means of an (adhesive) layer 66. The lower side of the foil 65 is also made adhesive, which is indicated by the (adhesive) layer 67 in FIG. 5, so that the layer 65 can be stuck onto the printed circuit board, which is the simplest manner of securing the reflecting foil. However, different securing techniques may be alternatively used.

The printed circuit board covered with the reflecting and adhesive foil is placed in the machine on a transport plate 20, while the carrier is automatically aligned with respect to the transport plate and hence with respect to the transport system by means of the holes 34 in the printed circuit board and the pins 33 of the transport plate 20. If the carrier has fiducials, their positions may be detected by means of the detection device 50. The machine operator can now introduce a calibration placement specification for the calibration components to be placed. A placement specification is a program for the machine, specifying the positions where, and by which placement heads, components must be placed on a carrier. The calibration placement specification may be considerably simpler than a production placement specification, because it is sufficient for the calibration that each placement head places only a small number of at least two components.

Subsequently, the calibration carrier is passed through all placement units 4, each unit placing components in an area of the printed circuit board reserved for the relevant placement unit. Each placement head positions the components in the same way as during the production process, i.e. using the component-positioning means. The only difference with the production process is that the placed components are not retained by soldering paste or glue, but by the adhesive foil.

Figure 6:
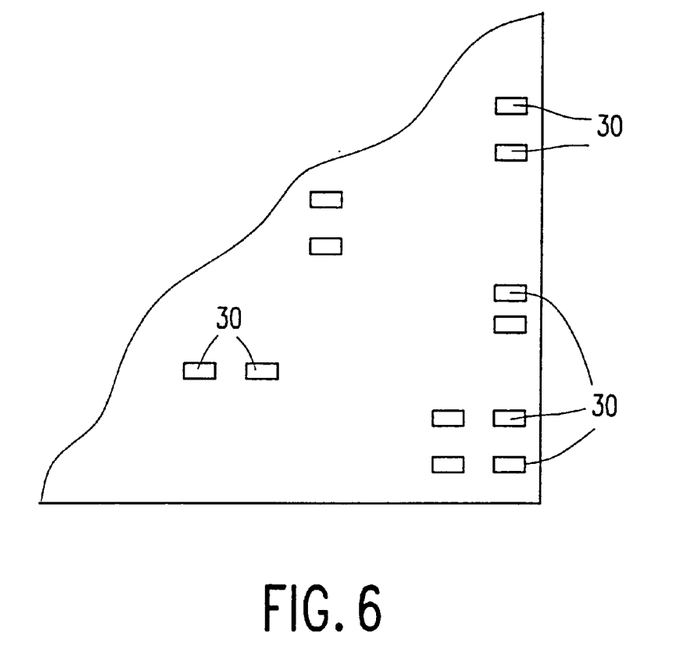
FIG. 6 is a plan view of a part of this carrier provided with components.

After the calibration carrier has passed the last placement unit, it will have been provided with all the desired components. FIG. 6 shows a small number of these components 30, provided on a small part of the calibration carrier. This calibration carrier is again fed into the placement machine so as to measure the positions of the placed components. To this end, the camera of the calibration carrier detection device 50 scans the entire surface of the calibration carrier in the X and Y directions. In practice, the camera generally has a small image field, for example 10×10 mm. The robot 51 of the calibration detection device is controlled in such a way that the camera is brought above the nominal position, relatively to machine references, of a placed component, whereafter the actual position of this component in the image field of the camera is measured via image processing. Subsequently, the camera of the module 55 is brought above the nominal position of a subsequent component, and so forth. Thus, measurements are only carried out at positions where components have been placed.

If a larger number of components is placed on the calibration carrier, for example, if a calibration placement specification has been used which is equal to the production placement specification, so that the calibration data can be used at a later stage during production placement for correction per component, it is possible that parts of more components are within the search range in the image field of the camera. The calibration detection device itself then ensures that only one component is completely within the image field and that only this component is measured. The search range is that part of the camera image field within which the calibration detection device 50 searches for components.

The operator may observe the measured component and its ambience on the monitor 15 shown in FIG. 1.

Since it is known, via the calibration placement specification, which placement head has placed each calibration component, it can be determined which placement unit or units are not, or have not been, set correctly if it is found that components have been placed in the wrong position or with an incorrect orientation. Then, such a unit can be corrected before the production placement is initiated. In the calibration procedure, as many components may be placed in the same positions as during the production placement. Then, the calibration placement specification is identical to the production placement specification. The data which are then obtained from the calibration procedure may be used in the subsequent production placement for correcting the placement position per component. The parts of the reflecting foil which are not covered by the calibration components constitute a satisfactorily reflecting background for these components. Since the usual components and their solder pads (not shown) often reflect to a lesser extent and, in any case more diffusely than this foil, a background illumination of the components is simulated by irradiating the carrier, i.e. the components appear as dark elements against a light background. An illumination beam whose rays are, in principle, perpendicularly incident on the carrier is preferably used in this case, and the imaging optics are adapted in such a way that only beam portions whose chief rays are perpendicularly incident on the calibration carrier are used for imaging an illuminating component with its ambience on the detector of the camera. It is thereby achieved that the contour of a component is imaged on the camera detector in a plane perpendicular to the optical axis. This has the advantage that the detection is independent of magnification errors which may occur in a curved or corrugated calibration carrier. Moreover, the detection has then become independent of the color and possible roundings of the components.

The calibration method may not only be used for a common check of the machine upon transition from a first type of production carrier, or printed circuit board, to another type and the attendant modification of the production placement specification, and upon replacement of components, but also for diagnostic purposes, i.e. for tracing errors in the machine. It is possible to measure the accuracy with which the placement heads operate, the accuracy of movement of the transport plates and the accuracy with which the placement heads can be aligned with respect to the transport plates, namely per index of these plates. The calibration method may also be used for the final check of the machine before delivery by the manufacturer.

To further enhance the reliability of the placement machine, a further number of calibration carriers can be passed through the machine, provided with components and the placed components can be detected, after the calibration procedure has been performed and the machine has been calibrated. The deviations in the positions of these components should then satisfy the imposed minimal requirements.

Instead of a production carrier covered with a reflecting foil, a special calibration carrier may be alternatively used which is a standard carrier for all types of production carriers which the machine can provide with components. In fact, the calibration placement specification may be adapted to the type of production carrier. The standard calibration carrier may have a satisfactorily reflecting surface. It is alternatively possible to provide a reflecting foil on a non-reflecting or less satisfactorily reflecting standard calibration carrier. After use, during a calibration procedure, this foil may be removed again and a new foil may be provided so that the calibration carrier can be used again.

Instead of the above-mentioned background illumination for detecting placed components, a foreground illumination may be alternatively used. In that case, use should be made of special calibration components which, upon their illumination, reflect more light than the carrier on which they are provided. Such components may be satisfactorily reflecting components, or fluorescent or phosphorescent components. It is alternatively possible to use components which are provided with an optically detectable, for example cross-shaped or rectangular, mark. Upon the calibration detection, the position of such a mark with respect to the desired position of the component on which the mark is provided is then determined. Said special calibration components may be placed on a standard calibration carrier or on a normal production carrier having a varying, but lower reflection than the calibration components.

Figure 7:
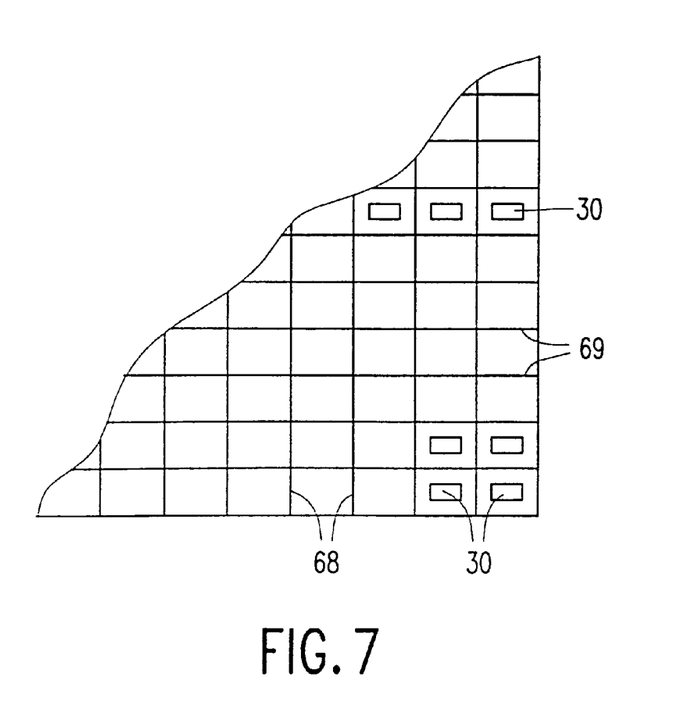
FIG. 7 shows a calibration carrier provided with a reference pattern.

Alternatively, a reference structure in the form of a two-dimensional network of narrow strips which are optically well detectable may be provided on a calibration carrier with a reflecting foil or on a calibration carrier which is satisfactorily reflective itself. FIG. 7 shows a part of such a structure of strips 68 and 69. The strip structure may be adapted to the calibration placement action specification, such that each component is placed within a square constituted by four strips. Upon detection of this component, these reference strips may be observed simultaneously with the component. Then, an absolute reference is obtained for the position of the placed components and it is possible to calibrate independently of the accuracy of the machine servosystems.

Figure 8:
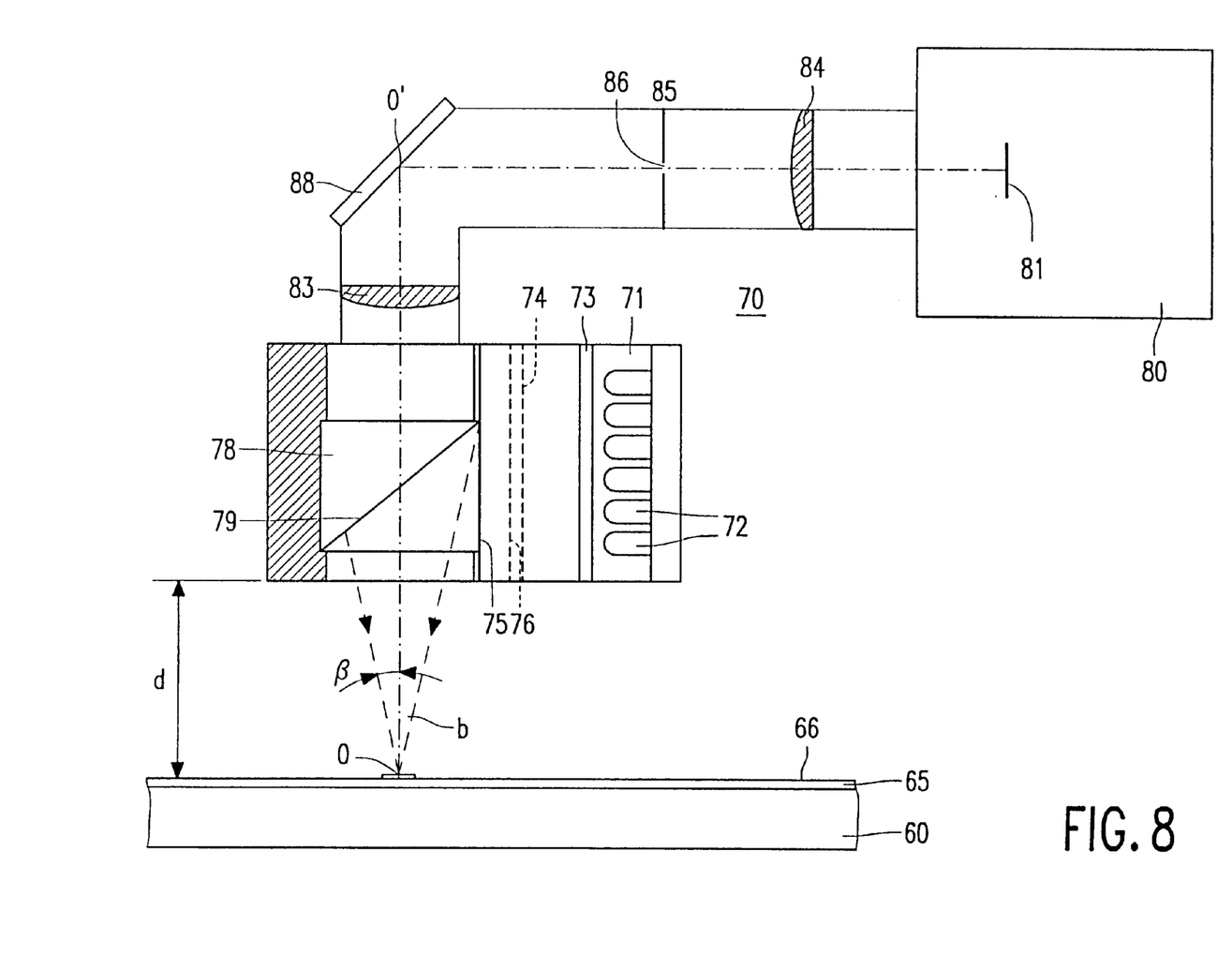
FIG. 8 shows an embodiment of an optical detection device.

FIG. 8 shows an embodiment of the optical module of an optical calibration detection device according to the invention. The illumination system 70 of this module comprises a radiation source 71 in the form of a number of light-emitting diodes (LEDs) 72 which are arranged in the form of, for example, a matrix. These light-emitting diodes have the advantage that they are small but supply sufficient radiation, have a long lifetime and are satisfactorily controllable. The radiation source precedes a diffuser 73 which diffuses the radiation in such a way that an illumination beam b passing through the window 75 of the housing 74 accommodating the radiation source and the diffuser has a principally uniform intensity distribution on the surface 66 of the foil or of a reflecting calibration carrier and, in principle, is a parallel beam. If desired, a second diffuser 76 may be accommodated in the housing 74.

The illumination beam b exiting from the window 75 is incident on a prism 78 having a partial, for example 50%, reflecting surface 79 which reflects a part of this beam towards the calibration carrier 60, 65 provided with components. The face 79 is placed at such an angle to the chief ray of the beam exiting from the window 75 and to the calibration carrier that the illumination beam b is perpendicularly incident on the carrier. Instead of the prism 78, a partially transparent mirror may be alternatively used. If use is made of a radiation source supplying linearly polarized radiation, the prism 78 may be alternatively replaced by a combination of a polarization-sensitive splitting prism and a quarter-wavelength plate. In principle, such a combination may reflect radiation towards the calibration carrier and pass radiation reflected by this carrier towards the camera without any loss of radiation.

For imaging the illuminated part of the calibration carrier on a radiation-sensitive detector 81, for example a CCD sensor, of a camera 80, the detection device comprises an imaging system consisting of, for example two lenses 83, 84 with a diaphragm 85 having an aperture 86 being arranged in between. The power of the lens 83 and the distance between this lens and the diaphragm 85 are chosen to be such that the image focus of this lens is situated in the plane of the diaphragm 85. The imaging system is thus telecentric on the side of the calibration carrier, i.e. only those rays of the radiation reflected by the calibration carrier and passed by the prism 78 that leave the surface 66 in a direction perpendicular to this surface are passed by the system. Consequently, the measuring height d has no influence on the size of the image on the sensor, so that even a good detection is possible if the calibration carrier is concave or convex or corrugated to some extent. The imaging system may include a folding mirror 88 for reducing the height of the system. The size of the image on the detector 81 is determined by the ratio between the focal lengths of the lenses 83 and 84. An imaging system which is telecentric at the object side and consists of the elements 83, 84 and 85 shown in FIG. 8 may instead consist of a composite lens whose aperture stop at the side of the calibration carrier is situated in the object focal plane. The telecentric imaging system may be implemented in various other ways.

Figure 9:
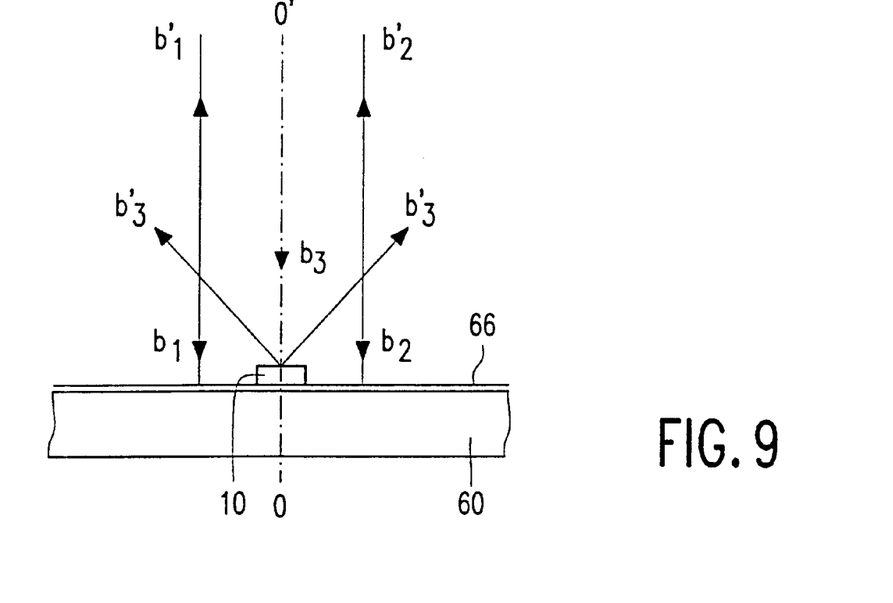
FIG. 9 shows illumination rays perpendicular to the carrier surface.

As already noted, the rays of the illumination beam are, in principle, parallel to the normal on the calibration carrier surface 66. This is the ideal situation if this carrier is positioned satisfactorily horizontally, i.e. when the normal on this carrier is parallel to the optical axis OO' of the lens system 83, 84, as is shown in FIG. 9. This Figure only shows the peripheral rays $b_1$ and $b_2$ and the central ray $b_3$ of the illumination beam. The rays $b_1$ and $b_2$ incident beside a component 30 are reflected towards the normal on the surface 66, as is shown by means of the rays $b_1'$ and $b_2'$ and are passed towards the detector 81 by the lens system. The central ray $b_3$, which is incident on the component, is diffusely reflected by this component, as is shown by means of the rays $b_3'$, so that only a small part of the radiation incident on the component is passed towards the detector 81 by the lens system.

Figure 10:
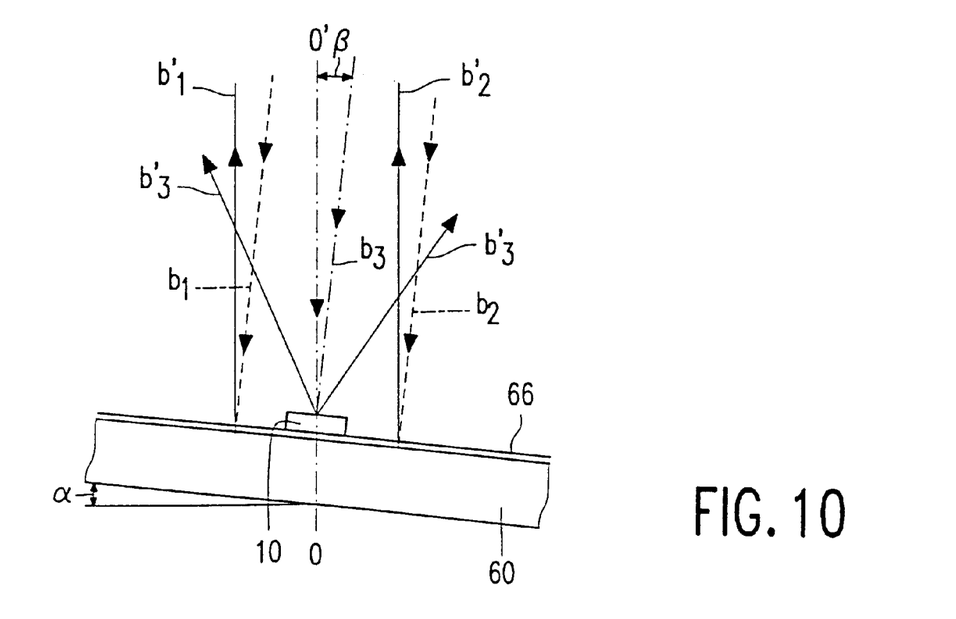
FIG. 10 shows illumination rays at an acute angle on the carrier surface.

In order to achieve that, even with a small tilt of the illuminated part of the carrier surface 66, hence with a curved or corrugated calibration carrier, sufficient radiation can reach the detector 81, it is ensured in practice, by the choice of the dimensions of the elements of the module 50 and the distances between these elements and by the use of a diffuser 73 (76), that rays of the illumination beam are also incident at a small angle β on the calibration carrier, as has already been shown diagrammatically in FIG. 8 and in greater detail in FIG. 10. The obliquely incident rays are then reflected by the oblique carrier portion in such a way that they pass through the lens system 83, 84, 85. If the maximum tilt angle α is expected to be 6°, the most oblique rays, the peripheral rays of the illumination beam, should extend at an angle β of 12° to the optical axis OO'. It is thereby achieved that the rays $b_1$, $b_2$ incident on the carrier outside the component 30 are reflected in such a way that these rays $b_1'$, $b_2'$ can pass through the lens system 83, 84, 85. The radiation incident on the component 30 is diffusely reflected again and is largely incident outside the diaphragm aperture 86 of the lens system. In order to achieve that the component 30 remains sufficiently dark with respect to its ambience, the foil or the calibration carrier surface, the angle β should not become too large, because otherwise a too large part of the radiation diffusely reflected by the component can pass through the lens system 83, 84, 85 and reach the detector 81. In the embodiment shown, the angle β is at most 12°.

The most optimum detection is realized by the combination of using a calibration carrier provided with a reflecting foil and illuminating it perpendicularly, i.e. with an illumination beam whose chief ray is perpendicular to the foil and the aperture angle is smaller than 30°. This perpendicular illumination is also best if a normal production carrier on which satisfactorily reflecting, fluorescent or phosphorescent components are placed is used for the calibration.

Instead of the perpendicular illumination described with reference to FIG. 8, an oblique illumination may be used under circumstances, i.e. the chief ray of the illumination beam extends at an angle deviating from 0° to the normal on the calibration carrier. This oblique illumination may be used for a calibration carrier which itself is satisfactorily reflective, or is provided with a reflecting foil and with normal components. The radiation specularly reflected by the carrier or the foil then does not pass through the lens system 83, 84 and 85 and the radiation diffusely reflected by a placed component does pass through this system. A placed component is then observed as a brighter element against a darker background.

If a production carrier or a less satisfactorily reflecting carrier is used as a calibration carrier on which standard components are placed, it is preferred to use an oblique illumination. Since these standard components reflect more diffusely than the calibration carrier, the camera receives more radiation from the components than from the carrier upon detection of the placed components, so that these components are observed as brighter elements against a darker background.

When using special calibration components which are provided with a mark or fiducial, the detection of the placed components is, in principle, independent of the reflection properties of the calibration carrier. Then, an illumination must be chosen which visualizes such a fiducial satisfactorily with respect to the component body.

As already noted, the feed-in section of a placement machine may include an optical carrier detection device for detecting special alignment marks during the production placement procedure on a production carrier to be provided with components, so that the positions on this carrier where components must be placed can be determined with respect to the transport system. In more advanced placement machines, this optical carrier detection device may be alternatively used for detecting the structure of conducting tracks and solder pads on the production carrier, so that this structure, referred to as the art work structure, can be used for determining the positions on the carrier where the components must be placed. When using the invention in a placement machine provided with said optical carrier detection device, this device may be used as a calibration detection device so that extra optical means for the calibration are then not necessary. If the calibration detection device is used for calibration purposes only, it may be alternatively arranged in the feed-out section of the machine.

Instead of a central calibration carrier detection device with an optical detection device for detecting all placed calibration components, the placement machine may also comprise a separate calibration detection device per placement head. Then, an optical detection device preferably comprising a CCD camera is secured to each placement head, and each placement unit is provided with an image-processing unit for this detection device. The components which are placed by the placement head associated with this detection device can then be detected with each detection device. An interface between a placement head and a calibration carrier detection device is then no longer necessary. The optical calibration detection devices secured to the placement heads may be alternatively used for detecting alignment marks or art work structures on production carriers.

Instead of the optical detection device shown in FIG. 8, the calibration detection device may comprise an optical height-measuring system, for example, one of the height-measuring systems described in U.S. Pat. Nos. 4,808,603 and 4,874,246. Such a height-measuring system can detect whether and where a component is present in an area on a carrier, because a component projects from the surface of this carrier.

The invention should not be construed as being limited to the description with reference to a special embodiment of the placement machine. The invention may be used in various types of placement machines comprising a number of placement units ranging from small to large numbers, and with various types of carrier and component-positioning means.

I claim:

1. A calibration carrier for use in calibrating a component placement machine, the calibration carrier comprising a carrier body having a surface area suitable for carrying a number of electronic components, characterized in that said surface area is covered with a reflecting foil which is adhesive on the side remote from the carrier, so that as part of the calibrating, calibration components can be stuck to the adhesive and positions of the calibration components can be distinguished by optical means from the carrier based on lesser reflectivity of the calibration components when compared with the reflective foil.

2. A calibration carrier as claimed in claim 1, characterized in that the foil is secured to the carrier by means of an adhesive layer.

* * * * *